United States Patent
Leibowitz et al.

(10) Patent No.: US 10,397,028 B2
(45) Date of Patent: *Aug. 27, 2019

(54) DECISION FEEDBACK EQUALIZER

(71) Applicant: Rambus, Inc., Sunnyvale, CA (US)

(72) Inventors: Brian S. Leibowitz, San Francisco, CA (US); Jaeha Kim, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 76 days.

This patent is subject to a terminal disclaimer.

(21) Appl. No.: 15/499,310

(22) Filed: Apr. 27, 2017

(65) Prior Publication Data

US 2017/0295040 A1 Oct. 12, 2017

Related U.S. Application Data

(63) Continuation of application No. 14/938,163, filed on Nov. 11, 2015, now Pat. No. 9,660,844, which is a
(Continued)

(51) Int. Cl.
*H04L 25/03* (2006.01)
*H03M 1/12* (2006.01)
(Continued)

(52) U.S. Cl.
CPC ...... *H04L 25/03057* (2013.01); *H03M 1/123* (2013.01); *H03M 1/1245* (2013.01);
(Continued)

(58) Field of Classification Search
CPC ......... H04L 25/03057; H04L 25/03146; H04L 25/03885; H04L 2025/03363;
(Continued)

(56) References Cited

U.S. PATENT DOCUMENTS 6,016,140 A 1/2000 Blouin et al.
6,614,434 B1 9/2003 Finke
(Continued)

FOREIGN PATENT DOCUMENTS

WO WO-2008-063431 A2 5/2008

OTHER PUBLICATIONS

Chung et al., "A 7.5-GS/s 3.8-ENOB 52-mW flash ADC with Clock Duty Cycle Control in 65nm CMOS," 2009 Symposium on VLSI Circuits Digest of Technical Papers, pp. 268-269. 2 pages.
(Continued)

*Primary Examiner* — Michelle M Koeth
(74) *Attorney, Agent, or Firm* — Silicon Edge Law Group LLP; Arthur J. Behiel

(57) ABSTRACT

A decision-feedback equalizer (DFE) samples an analog input signal against M references during the same symbol time to produce M speculative samples. Select logic in the DFE then decodes N bits resolved previously for previous symbol times to select one of the M speculative samples as the present resolved bit. The present resolved bit is then stored as the most recent previously resolved bit in preparation for the next symbol time. The select logic can be can be programmable to accommodate process, environmental, and systematic variations.

19 Claims, 9 Drawing Sheets

Related U.S. Application Data continuation of application No. 13/578,217, filed as application No. PCT/US2010/058088 on Nov. 24, 2010, now Pat. No. 9,215,112.

(60) Provisional application No. 61/307,190, filed on Feb. 23, 2010.

(51) Int. Cl.
*H03M 1/00* (2006.01)
*H03M 1/36* (2006.01)

(52) U.S. Cl.
CPC .. *H04L 25/03146* (2013.01); *H04L 25/03885* (2013.01); *H03M 1/004* (2013.01); *H03M 1/362* (2013.01); *H04L 2025/03363* (2013.01); *H04L 2025/03369* (2013.01)

(58) Field of Classification Search
CPC ........ H04L 2025/03369; H03M 1/123; H03M 1/1245; H03M 1/004; H03M 1/362
See application file for complete search history.

(56) References Cited

U.S. PATENT DOCUMENTS

| | | | |
|---|---|---|---|
| 6,980,140 B1 | 12/2005 | Rowland et al. | |
| 7,323,922 B1 | 1/2008 | Jones | |
| 7,368,946 B1 | 5/2008 | Rahman et al. | |
| 7,567,616 B2 | 7/2009 | Lin | |
| 7,656,340 B2* | 2/2010 | Gribok | H03M 1/002 341/155 |
| 9,215,112 B2* | 12/2015 | Leibowitz | H04L 25/03146 |
| 9,660,844 B2* | 5/2017 | Leibowitz | H04L 25/03146 |
| 2003/0142740 A1* | 7/2003 | Haunstein | H04L 7/033 375/233 |
| 2004/0203559 A1* | 10/2004 | Stojanovic | H04L 25/063 455/403 |
| 2004/0228337 A1 | 11/2004 | Naoi et al. | |
| 2006/0168637 A1* | 7/2006 | Vysotsky | H04L 12/1813 725/116 |
| 2007/0110199 A1 | 5/2007 | Momtaz et al. | |
| 2008/0049825 A1 | 2/2008 | Chen et al. | |
| 2008/0101510 A1 | 5/2008 | Agazzi | |
| 2008/0191910 A1 | 8/2008 | Simpson | |
| 2008/0219390 A1 | 9/2008 | Simpson et al. | |
| 2009/0279597 A1 | 11/2009 | Bereza et al. | |
| 2009/0304066 A1* | 12/2009 | Chmelar | H03M 1/002 375/233 |
| 2010/0195776 A1* | 8/2010 | Chmelar | H03M 1/1215 375/359 |

OTHER PUBLICATIONS

Chung et al., "Design-Space Exploration of Backplane Receivers with High-Speed ADCs and Digital Equalization," IEEE 2009 Custom Integrated Circuits Conference, Sep. 2009, pp. 556-658, 4 pages.

Graf, Rudolf F., "Modern Dictionary of Electronics," Seventh Edition, 1999, p. 180. 6 pages.

Harwood, M. et al., "12.5Gb/s SerDes in 65nm, CMOS Using a Baud-Rate ADC with Digital Receiver Equalization and Clock Recovery", ISSCC 2007/Session24/Multi-GB/s Transceivers/24.1. 10 Pages.

Harwood, M. et al., "A 12.5GB/s SerDes in 65nm CMOS Using a Baud Rate ADC with Digital RX Equalization and Clock Recovery", 2007 IEEE International Solid-State Conference. 18 Pages.

International Preliminary Report on Patentability (Chapter I) dated Sep. 7, 2012 in International Application No. PCT/US2010/058088. 6 pages.

International Search Report and the Written Opinion dated Mar. 31, 2011 re Int'l. Application No. PCT/US2010/058088. 9 Pages.

MAXIM Integrated Products, "Understanding Flash ADCs", Application Note 810 dated Oct. 2, 2001. 8 Pages.

Shahramian et al., "A 35-GS/s, 4-Bit Flash ADC With Active Data and Clock Distribution Trees," IEEE Journal of Solid-State Circuits, vol. 44, No. 6, Jun. 2009, pp. 1709-1720. 12 pages.

Varzaghani et al., "A 4.8 GS/s 5-bit ADC-Based Receiver With Embedded DFE for Signal Equalization," IEEE Journal of Solid-State Circuits, vol. 44, No. 3, Mar. 2009, pp. 901-915. 15 pages.

Varzaghani et al., "A 6-GSamples/s Multi-Level Decision Feedback Equalizer Embedded in a 4-bit Time-Interleaved Pipeline A/D Converter", IEEE Journal of Solid-State Circuits, vol. 41, No. 4, pp. 935-944, Apr. 2006, 10 Pages.

* cited by examiner

US 10,397,028 B2

DECISION FEEDBACK EQUALIZER

BACKGROUND

In digital systems information is represented by patterns of "symbols," much as words are represented by patterns of letters. Binary systems represent information using just two symbols to alternatively represent a logical one or a logical zero. In a common example, a relatively high voltage state may represent a one symbol and a relatively low voltage state a zero symbol. A series of symbols can thus be communicated as a voltage signal that alternates between low and high values in a manner that reflects the series. For example, a digital transmitter can convey a series of symbols over a channel by sequentially injecting high and low voltage levels as necessary to replicate the series. The time each voltage level is held on the channel to represent a symbol is termed the "symbol time," and the speed with which symbols can be communicated the "symbol rate." A digital receiver can then recover each symbol by comparing the voltage for each symbol time against a reference voltage to distinguish between high and low voltages.

High performance communication channels suffer from many effects that degrade symbols, and consequently render them difficult to resolve. Primary among them are frequency dependent channel loss (dispersion) and reflections from impedance discontinuities. Both of these effects cause neighboring symbols to interfere with one another, and are commonly referred to collectively as inter-symbol interference (ISI). For example, neighboring relatively high-voltage symbols may spread out to raise the level of neighboring low-voltage symbols; if the resulting voltage distortion is sufficiently high, the low-voltage symbols may be interpreted incorrectly. Lower-voltage symbols may likewise induce errors in neighboring higher-voltage symbols.

ISI becomes more pronounced at higher signaling rates, ultimately degrading signal quality such that distinctions between originally transmitted symbols may be lost. Some receivers therefore mitigate the effects of ISI using one or more equalizers, and thus increase the available symbol rate. One common type of equalizer used for this purpose, the decision-feedback equalizer (DFE), corrects for ISI by multiplying recently received symbols by respective tap coefficients and either subtracting the resultant products from the received signal or adding the resultant products to the reference against which the symbol is interpreted. If a recently received symbol of a relatively high voltage is known to increase the level of a current symbol by a given amount, for example, then that same amount can be subtracted from the incoming voltage or added to the reference to correct for the distortion. The same principle can be extended to multiple preceding symbols.

In very high-speed systems it can be difficult to resolve recently received symbols in time to calculate their impact on incoming symbols. Some receivers therefore ignore the impact of recent symbols on the incoming signal, and consequently fail to correct for the ISI attributed to those symbols. Other receivers employ partial-response DFEs (PrDFEs) that obtain multiple samples of the incoming data using multiple correction coefficients, one for each of the possible values of the most recently received symbol or symbols. The correct sample is then selected after the most recently received symbol or symbols are resolved. For example, if it is not yet known whether a preceding symbol was of a relatively high or low voltage, and therefore whether to reduce or raise the voltage level of the current symbol to correct for ISI, then two forms of the current symbol are adjusted and sampled, one for each possibility. The correct one of the two samples is then selected after the preceding symbol is resolved.

PrDFEs are effective, but require a separate subtraction and sampling path for each possible value of the most recently received symbol or, in the case of multiple symbols (multi-symbol PrDFE), a separate computational path for each possible combination of the multiple symbol values. This results in e.g. $2^N$ sampling paths in a binary PrDFE system that considers N prior symbols. The complexity and power usage thus grows exponentially with the number of prior symbols being considered.

BRIEF DESCRIPTION OF THE DRAWINGS

The subject matter disclosed is illustrated by way of example, and not by way of limitation, in the figures of the accompanying drawings and in which like reference numerals refer to similar elements and in which:

FIG. 7 depicts a DFE 700 in accordance with another embodiment that is similar to DFE 100, with like numbered components being the same or similar.

DETAILED DESCRIPTION

The present invention provides an equalizer. More particularly, this equalizer can be implemented in a receive circuit used to sample an input analog signal and resolve the input analog signal into a stream of bit values. The equalizer comprises an analog-to-digital converter (ADC) to sample an analog signal during a given symbol time to produce M speculative samples, select logic to convey a selected one of the M speculative samples as a presently resolved bit, and storage to store at least one previously resolved bit. The select logic selects the presently resolved bit based on a correspondence between the at least one previously resolved bit and the M speculative samples. The correspondence can be established using dedicated logic, or can be programmable to accommodate process, environmental, and systematic variations that impact how ISI affects performance. The equalizer can be implemented in a single-data-rate (SDR) receive circuit, a double-data-rate (DDR) receive circuit, a quad-data-rate (QDR) receive circuit, or some other type of receive circuit.

In an SDR receive circuit, the "at least one previously resolved bit" can represent one or more data bits previously resolved from the ADC's speculative samples. In DDR or QDR receive circuits, two or more ADCs can be used, and the "at least one previously resolved bit" used to resolve a bit from one ADC can be or include one or more previously resolved bit from another ADC, e.g., one ADC can be used for even phase sampling and one ADC can be used for odd phase sampling. Other designs are also possible (e.g., the use of three or more ADCs to resolve four-level signals, "4-PAM"). By permitting use of programmable logic, e.g., a programmable correspondence between the one or more ADCs and each possible "decision feedback value" (e.g., assigning each such decision feedback value to one of several thermometer-coded outputs of the ADC), the embodiments discussed below provide relatively flexible, fast and low-power vehicles for implementing decision feedback.

Figure 1:
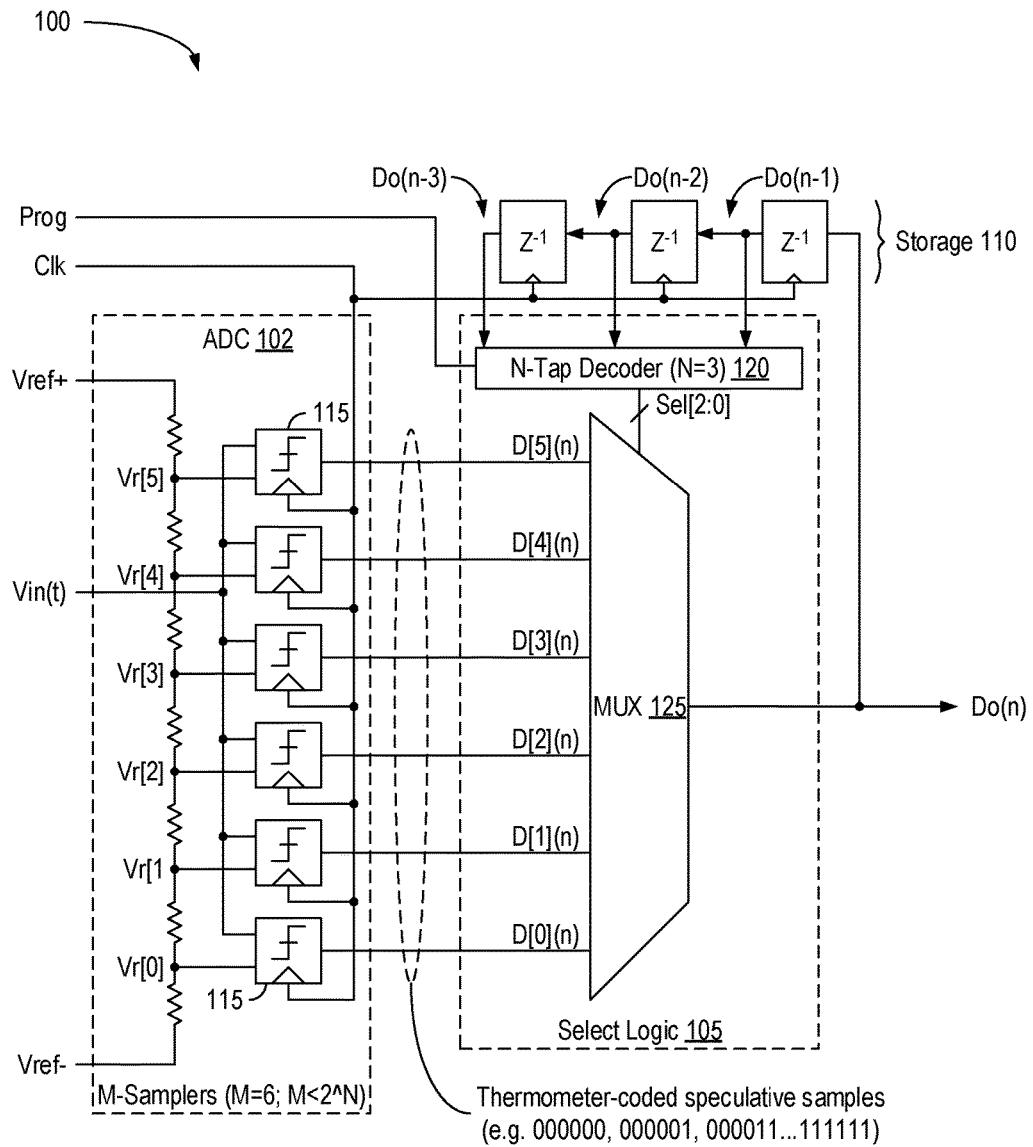
FIG. 1 depicts a decision-feedback equalizer (DFE) 100 in accordance with one embodiment.

FIG. 1 depicts a decision-feedback equalizer (DFE) 100 in accordance with an SDR embodiment. DFE 100 receives an analog signal communicating a series of symbols as varying voltage levels. To recover each symbol, DFE 100 samples the analog input signal during the respective symbol time with respect to a range of M references to produce M speculative samples. DFE 100 stores previously resolved bits associated with prior symbol times and uses them as a predictor of ISI for the current symbol time. DFE 100 decodes N of the previously resolved bits to select one of the M speculative samples as the presently resolved bit. Absent error, the presently resolved bit is the digital value of the symbol expressed in the instant symbol time. This value is then stored as a previously resolved bit for consideration during a subsequent symbol time. In this embodiment, the number N of previously resolved bits used in the selection of the presently resolved bit is greater than the number required to uniquely specify one of M speculative sample bits.

DFE 100 includes an analog-to-digital converter (ADC) 102 that converts analog input signal Vin(t) to a six-bit binary signal $D[5:0](n)$, each bit of which represents a speculative sample for a given symbol time. These speculative samples are conveyed on respective output nodes to some select logic 105. Select logic 105 selects one of the speculative samples as the presently resolved bit Do(n) using three previously resolved bits from storage 110 (e.g., a shift register). As detailed below, this selection is based on a programmable correspondence between the previously resolved bits in storage 110 and the M speculative samples of signal $D[5:0](n)$.

ADC 102 includes a voltage divider, disposed between two reference nodes Vref+ and Vref−, that provides six reference voltages Vr[5:0] to the reference nodes of six samplers 115. Each of samplers 115 samples input signal Vin(t) with respect to its corresponding voltage reference on edges of a clock signal Clk to produce one of speculative samples $D[5:0](n)$. For example, the upper-most sampler 115 samples signal Vin(t) with respect to reference voltage Vr[5] to produce speculative sample $D[5](n)$. Reference voltages Vr[5:0] are spaced, evenly in this example, with voltage Vr[0] being the lowest and voltage Vr[5] the highest. A comparison with input signal Vin(t) thus produces a thermometer-coded, six-bit digital representation of the analog level of input signal Vin(t). The possible bit combinations for speculative samples $D[5:0](n)$, absent errors, are thus 000000b, 000001b, 000011b, 000111b, 001111b, 011111b, and 111111b. Other coding schemes can be used in other embodiments, and the reference voltages can be differently spaced and collectively or independently adjustable. DFE 100 can additionally support more or fewer samplers and associated speculative samples.

Select logic 105 includes an N-tap decoder 120 and a multiplexer 125. Decoder 120 decodes the three previously resolved bits in storage 110, consecutive bits in this example, to derive a three-bit select input Sel[2:0] to multiplexer 125. Multiplexer 125 selects one of the six sampler outputs from ADC 102 based upon this decoded value. Select logic 105 can be dedicated logic, but the correspondence between the previously resolved bits and the speculative samples is programmable in this example to accommodate process, environmental, and systematic variations that impact how ISI affects performance. A programming port Prog can be used to permanently or temporarily configure decoder 120 to select from among speculative samples $D[5:0](n)$ for each possible pattern in storage 110.

Storage 110 stores three binary bits in this example, so decoder 120 can decode $2^3$, or eight, possible combinations of previously resolved bits. ADC 102 only has six samplers 115, however, so some different combinations of previously resolved bits decode to the same sampler. Some samplers may not be used at all, in which case they may be disabled to save power. For example, programming port Prog can extend to ADC 102 to disable one or more of samplers 115. In other embodiments different numbers of samplers can be used in different modes (e.g., fewer samplers may be used in a low-speed, low-power mode).

ISI due to previously received symbols causes voltage variations in the instant symbol represented by signal Vin(t). In a binary system with a dispersive channel characteristic, for example, prior symbols represented using a relatively high voltage tend to raise voltage level Vin(t), and prior symbols represented using a relatively low voltage tend to reduce voltage level Vin(t). Whether a given voltage level represents a logic one or a logic zero therefore depends upon the levels of prior symbols. Furthermore, this dependency is not fixed, but instead depends upon device-specific and systematic variables. The effects of ISI can be impacted by, for example, the type and length of a communication channel, the modulation scheme, temperature, supply voltage, and process variations that occur in the fabrication of transmitters and receivers.

As should be apparent, therefore, the system presented in FIG. 1 provides a number of advantages, not the least of which that select logic 105 may be programmably configured to assign dependency between each historical pattern of previously resolved bits and one of the M speculative samples $D[5:0](n)$. DFE 100 can thus be calibrated for a given application. In one such calibration procedure, test patterns are applied to DFE 100 as signal Vin(t) and the resolved bits Do(n) monitored for errors. Decoder 120 maps each pattern of previously resolved bits to different speculative samples $D[5:0](n)$ to determine which provides the best error margin. Such calibration may be done once, to account for time-invariant parameters, such as channel characteristics and process variations, or may be carried out continuously or periodically to account for time-variant parameters, such as supply-voltage and temperature. For example, the calibration may be done at system integration or each time the system is powered up (e.g., as part of a configuration routine), or periodically during system operation.

Figure 2:
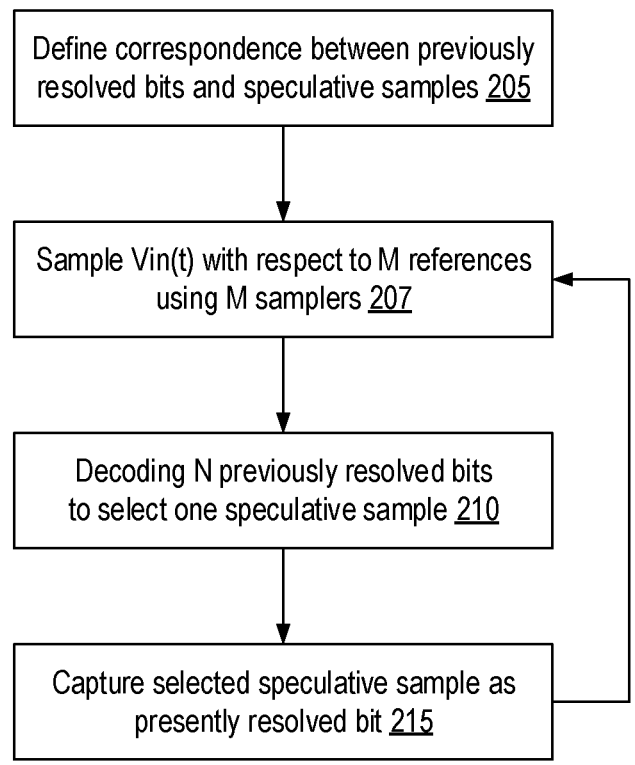
FIG. 2 is a flowchart 200 depicting the operation of a DFE 100 of FIG. 1 in accordance with one embodiment.

FIG. 2 is a flowchart 200 depicting the operation of a DFE 100 in accordance with one embodiment. Beginning at 205, decoder 120 is programmed to define a correspondence between previously resolved bits and the M speculative samples. This programming can be accomplished using calibration procedures detailed below. Once DFE 100 is thus programmed, ADC 102 employs M samplers 115 to sample signal Vin(t) with respect to M reference voltages Vr[5:0] during the same symbol time (207). Most of the resulting speculative samples are based upon sub-optimum reference voltages, and thus have a high error probability. Per 210 of FIG. 2, select logic 105 therefore decodes N previously resolved bits in storage 110 to select the output of the one of samplers 115 associated with the reference voltage that best accounts for the ISI from the previously resolved bits. Storage 110 then shifts in the presently resolved bit, the output of sampler output Do(n), which then becomes previously resolved bit Do(n-1) in the next sample instant (215). The process then returns to 205 and repeats for the next and all successive symbol times of signal Vin(t).

Figure 3:
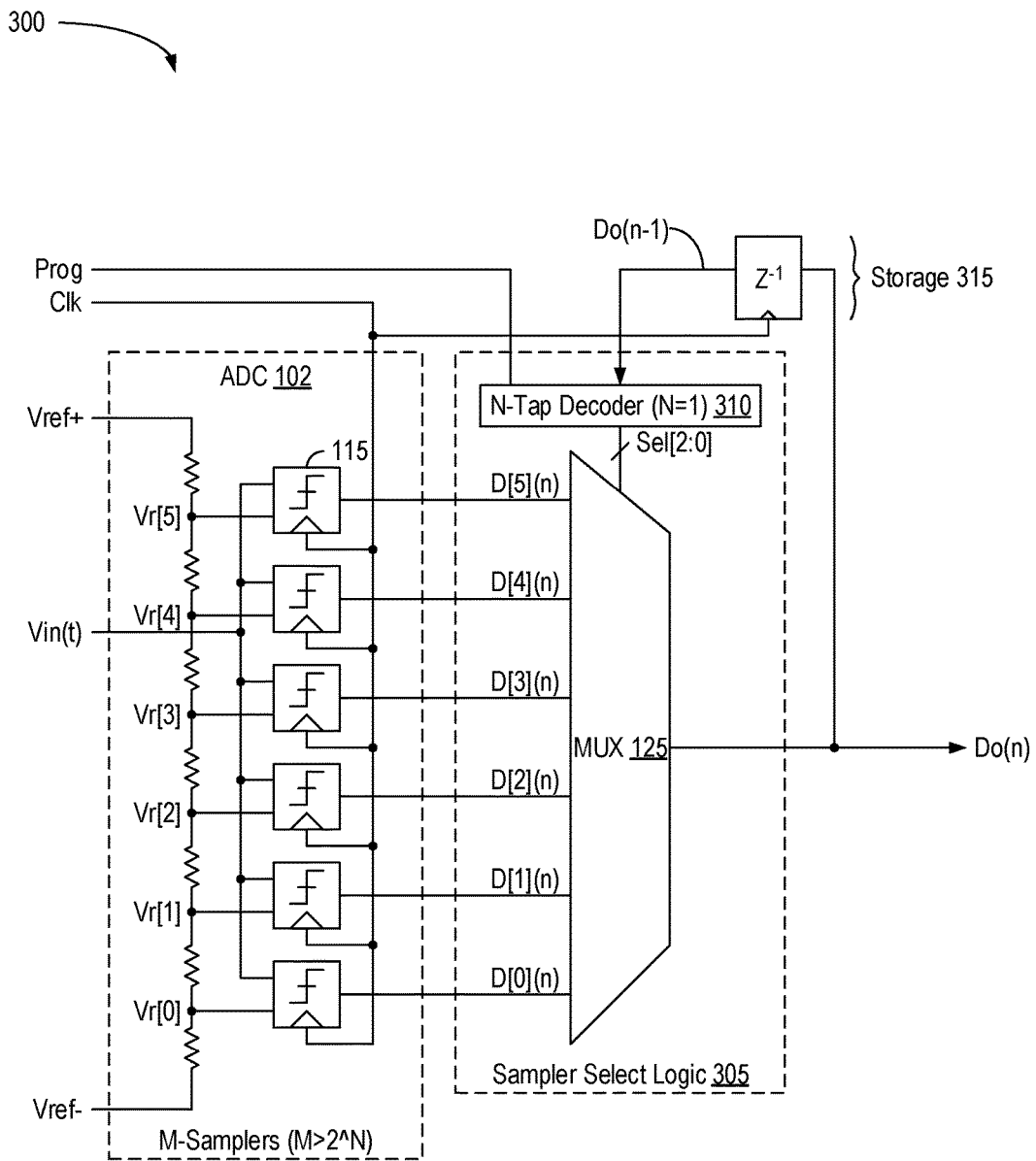
FIG. 3 depicts a DFE 300 in accordance with another embodiment.

FIG. 3 depicts a DFE 300 in accordance with another embodiment. DFE 300 is similar to DFE 100 of FIG. 1, with like-identified elements being the same or similar. ADC 102 likewise samples an analog input signals Vin(t) with respect to six reference voltages Vr[5:0] to produce six speculative samples D[5:0](n). DFE 300 differs from DFE 100, however, in that select logic 305 of DFE 300 resolves the correct sample based upon fewer previously resolved bits. In particular, storage 315 stores a single previously resolved bit to select one of six speculative samples D[5:0](n). The number N is thus less than the number required to uniquely select each speculative sample. The numbers M and N are six and one in this example; more generally, M is greater than two to the power of N for binary signaling (i.e., M>2^N). Decoder 310 can thus be configured such that DFE 300 selects between any two of the six available speculative samples D[5:0](n). Such an embodiment provides flexibility in terms of the applied voltage reference or references without the attendant complexity of providing tunable reference voltages. As in other embodiments, samplers not in use can be disabled to save power.

Figure 4A:
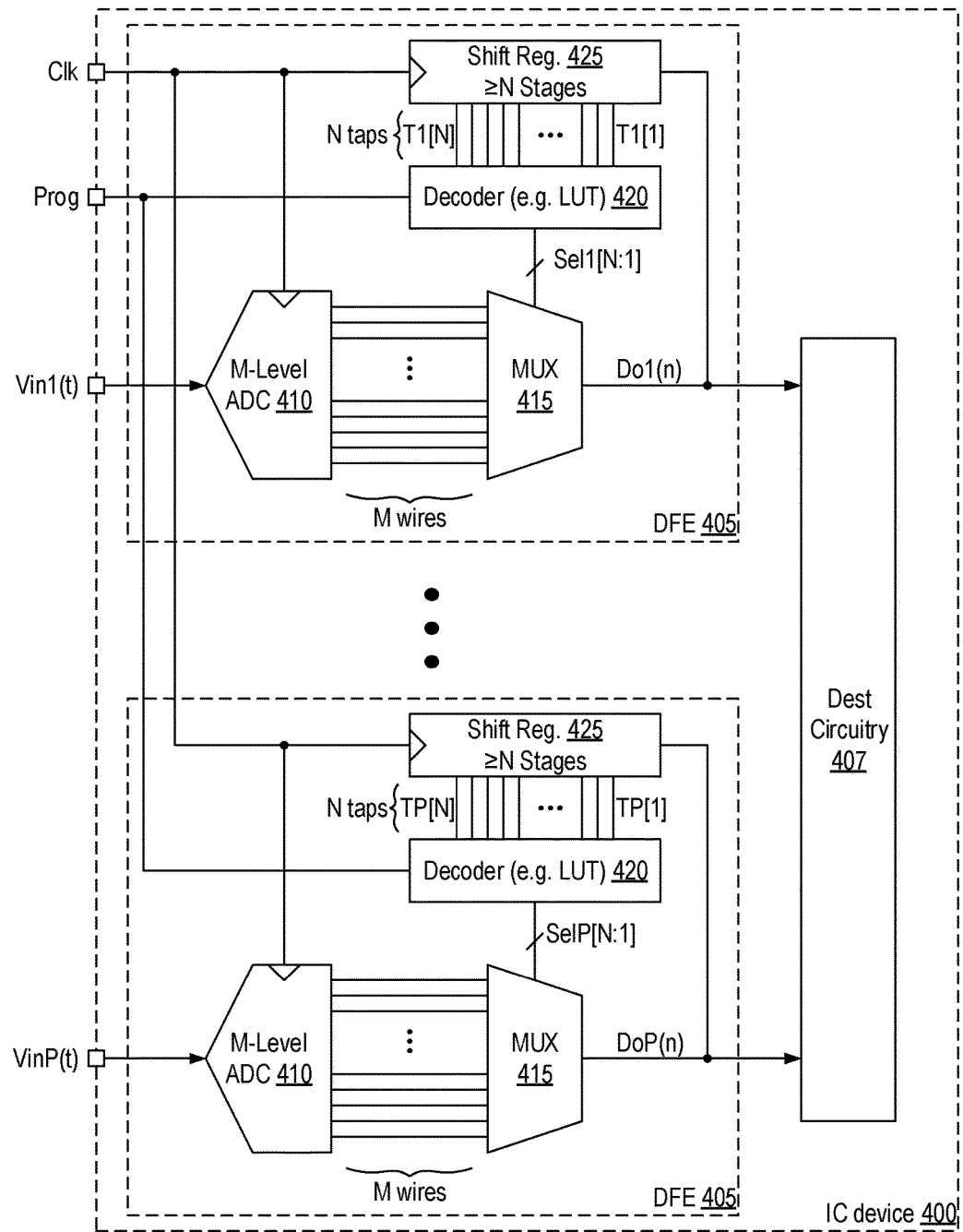
FIG. 4A depicts an integrated circuit device 400 that includes multiple DFEs 405 to support multiple communication channels, one for each of P input signals Vin[P:1](t).

FIG. 4A depicts an integrated circuit (IC) device 400 that includes multiple DFEs 405 to support multiple communication channels, one for each of P input signals Vin[P:1](t). DFEs 405 sample input signals Vin[P:1](t) to recover respective digital signals Do[P:1](n), which are conveyed to some destination circuitry 407. This destination circuitry can be whatever requires the received data. In a memory device, for example, destination circuitry 407 can include data, address, and request buffers. Destination circuitry 407 can additionally include support for test and calibration procedures, as discussed below in connection with FIGS. 4B and 4C. The DFEs 405 are identical, so the following discussion is limited to the DFE 405 associated with input signal Vin1(t).

DFE 405 includes an M-level ADC 410, a multiplexer 415, a decoder 420, and a shift register 425. Shift register 425 stores some number of previously resolved bits to provide N filter taps T[N:1] to decoder 420. Decoder 420 decodes the N previously resolved bits to produce a select signal Sel1[N:1], which multiplexer 415 then uses to select from among the M outputs from ADC 410. Multiplexer 415 selects one of the ADC outputs, though the number N of filter taps used in the selection can be different from the number required to uniquely specify one of the M ADC outputs.

Where the number of bits in shift register 425 is greater than N, DFE 405 can include select circuitry (not shown) between shift register 425 and decoder 420 to allow different subsets of previously resolved bits to serve as the N selected bits. Decoder 420 can thus base its sampler selection upon taps of latencies that would otherwise be outside of the N taps to decoder 420. For example, the tap for the Nth previously resolved bit could be substituted with the tap for an older bit. An external programming port Prog to device 400 is used to program decoder 420, and can be used to configure tap latency and speculative-sample selection as noted above. For example, port Prog can be coupled to a command bus that communicates with decoder 420 to load a look-up table with values that establish a correspondence between the patterns in shift register 425 and the speculative samples from ADC 410. The configurations for DFEs 405 can be the same for each of channels Vin1(t) and VinP(t), or can be channel specific, and programming may be accomplished or aided by circuitry internal to device 400.

Figure 4B:
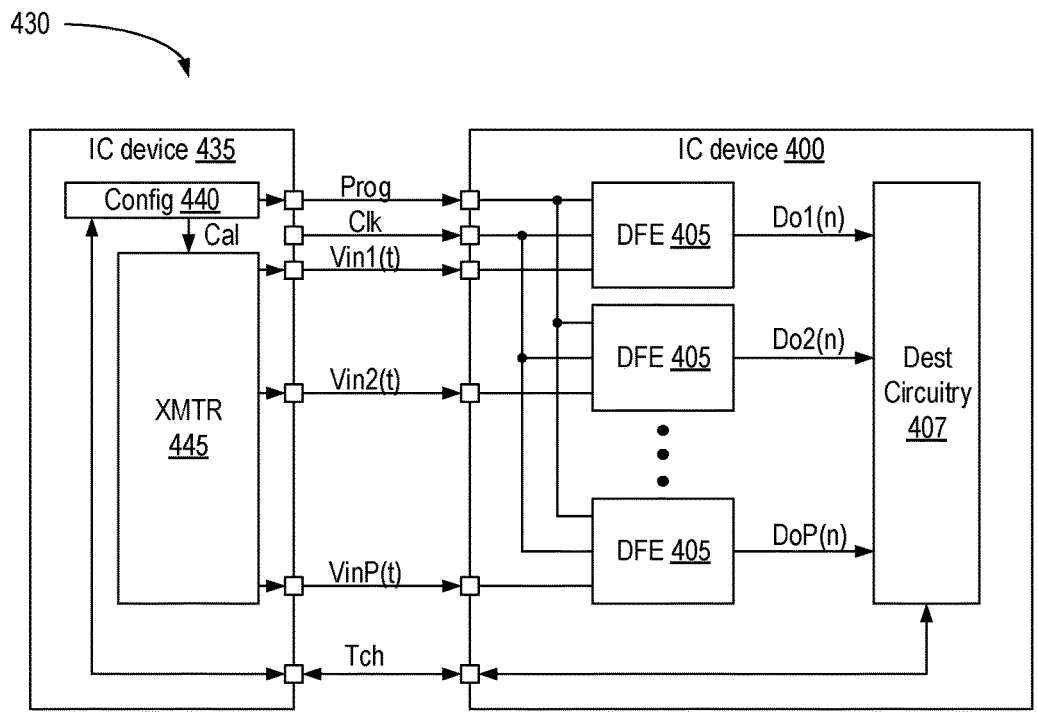
FIG. 4B depicts a communication system 430 that includes an IC device 435 connected to device 400 of FIG. 4A via multiple channels.

FIG. 4B depicts a communication system 430 that includes an IC device 435 connected to device 400 of FIG. 4A via multiple channels. Device 435 includes configuration logic 440 and a multi-channel transmitter 445. In addition to the channels discussed above in connection with FIG. 4A, system 4B includes one or more test channels Tch between destination circuitry 407 and configuration logic 440. Test channel Tch allows configuration logic 440 to pass calibration instructions to device 400 and to receive feedback in support of calibration procedures, as discussed below.

Figure 4C:
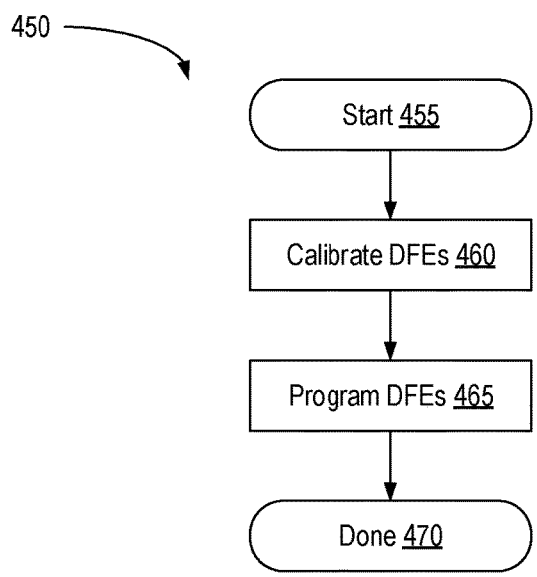
FIG. 4C depicts a flowchart 450 illustration a calibration procedure for system 430 of FIG. 4B.

FIG. 4C depicts a flowchart 450 illustrating a calibration procedure for system 430 of FIG. 4B. Calibration may be done once, to account for time-invariant parameters, or may be carried out continuously or periodically to account for time-variant parameters, such as supply-voltage and temperature. As mentioned, configurations can be the same for the multiple channels or can be different; if the channels are very similar, then it may be desired to perform the calibration for only one channel, with the calibrated programmable correspondence for that channel being programmed in common into the DFE for each channel. Alternatively, each channel can be separately calibrated and programmed, via independent processes.

Beginning at 455, configuration logic 440 uses a calibration bus Cal and test channel Tch to instruct transmitter 445 and destination circuitry 407 to enter a calibration mode. In the calibration mode (460), transmitter 445 sends test patterns to DFEs 405 while destination circuitry 407 monitors the received signals for errors. The resulting error data is passed back to device 435 to allow configuration logic 440 to correlate errors to the decoder settings. In other embodiments configuration logic 440 identifies signaling errors, rather than device 400. For example, destination circuitry 407 may generate checksums for the received signals and pass them back to configuration logic 440 for use in error detection. These tests are repeated for each pattern of historical data to determine the optimum settings for decoder 420 (FIG. 4A).

Having thus identified the best settings for each pattern of historical data, configuration logic 440 programs DFEs 405 (465) store the optimized decoder settings permanently or until they can be updated during a subsequent calibration. One-time programming can be accomplished using e.g. fuses or antifuses, while various forms of rewritable memory can be used in support of reconfigurability. The settings can be optimized for each DFE 405, or all or a subset of DFEs 405 can share settings and the memory used to store them. Once the settings are optimized (470), configuration logic 440 uses calibration channel Cal and test channel Tch to place devices 435 and 400 in the operational mode.

Figure 5:
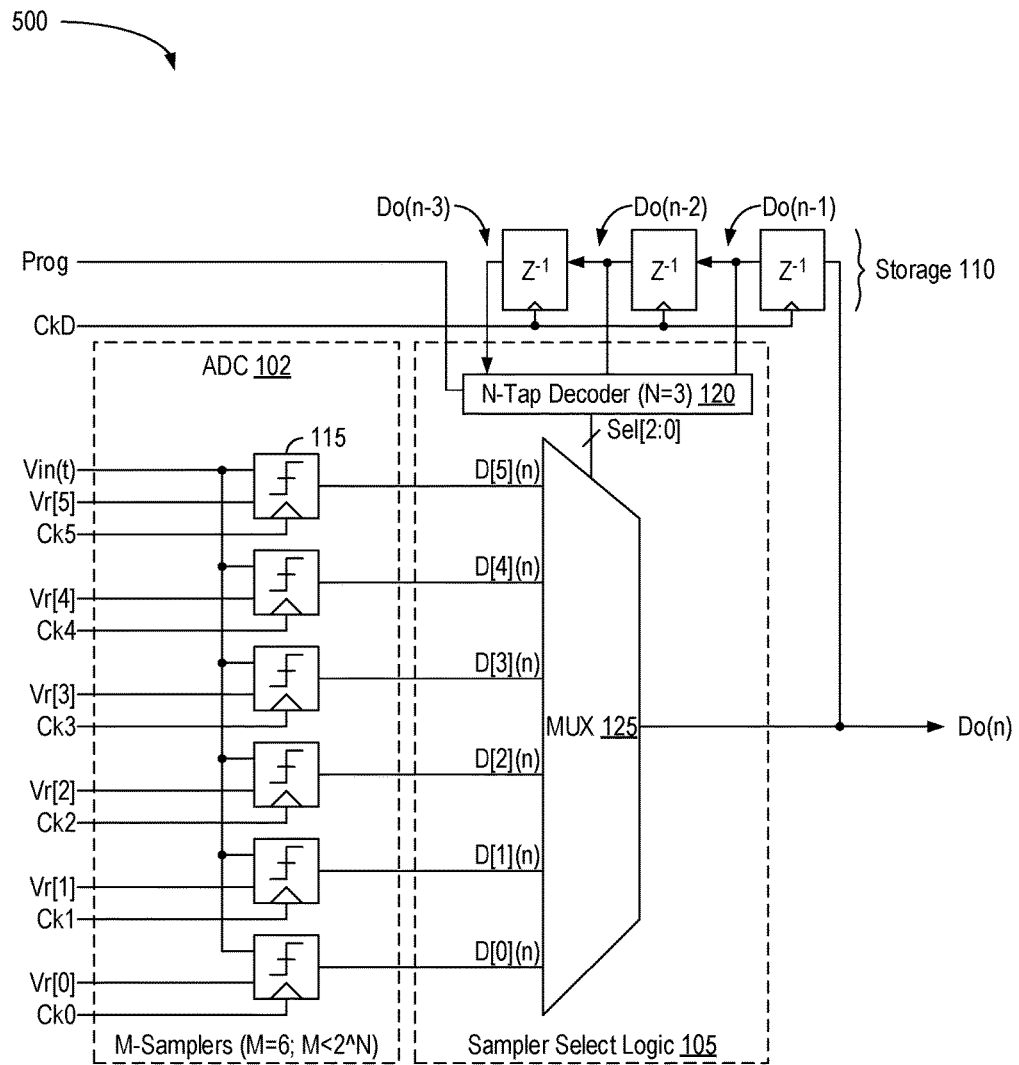
FIG. 5 depicts a DFE 500 in accordance with another embodiment.

FIG. 5 depicts a DFE 500 in accordance with another embodiment. DFE 500 is similar to DFE 100 of FIG. 1, with like-numbered elements being the same or similar. DFE 500 differs from DFE 100 in that samplers 115 of ADC 102 are each provided with a separate clock signal Ck[5:0]. The phases of these clock signals can vary with respect to one another, and with respect to data clock CkD to storage 110. Select logic 105 can thus be configured to choose a preferred sample instant within a given symbol time, as well as a preferred reference voltage, based on previously resolved data.

Figure 6:
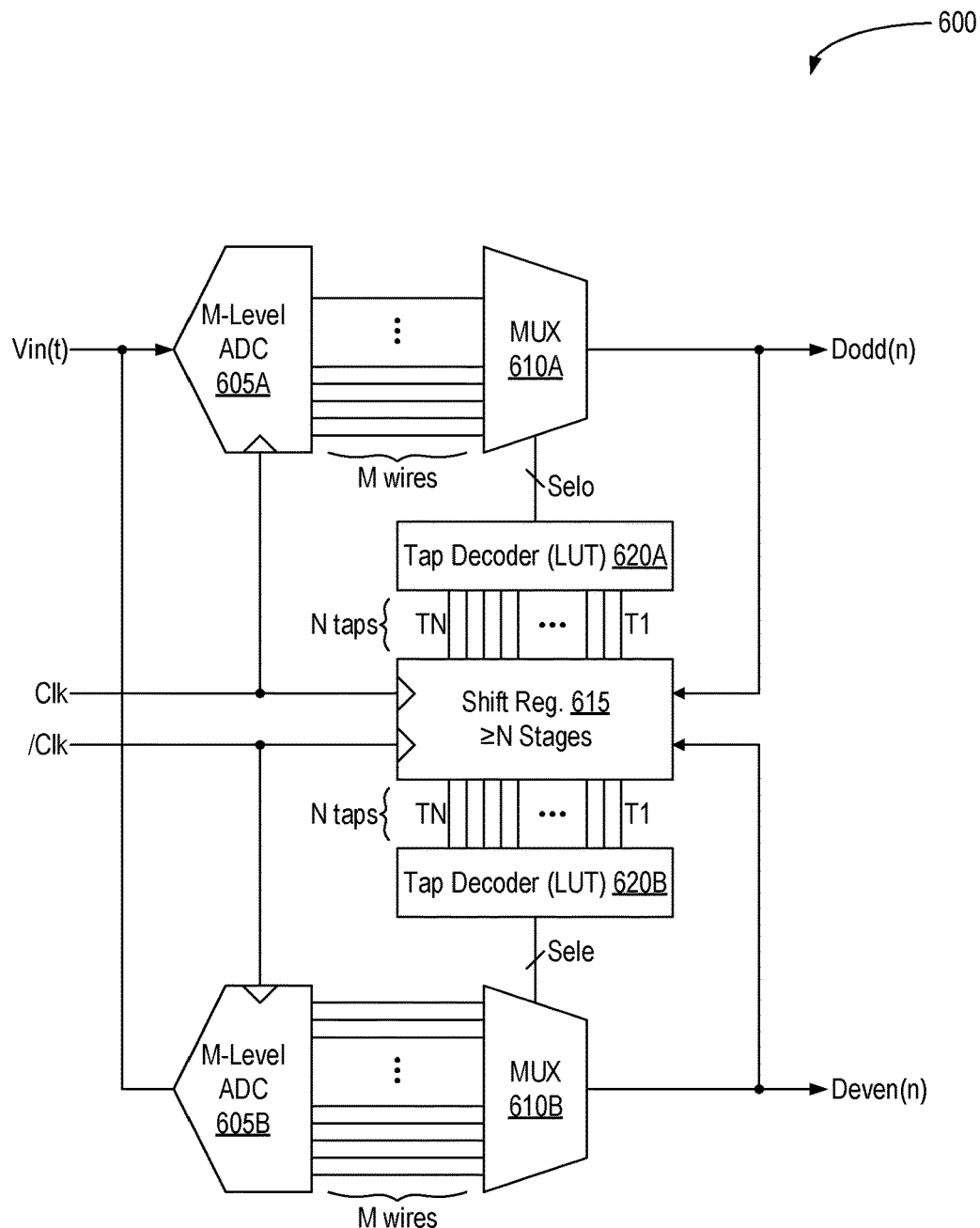
FIG. 6 depicts a DFE 600 in accordance with a double-data-rate (DDR) embodiment.

FIG. 6 depicts a DFE 600 in accordance with a DDR embodiment. DDR systems transfer symbols on both rising and falling edges of a clock signal, which allows the clock signal to operate at half the symbol rate. DFE 600 uses two similar DFE structures to sample odd and even symbols of input signal Vin(t) on respective rising and falling edges of a clock signal Clk to produce odd and even data Dodd(n) and Deven(n). Rising edges of complementary clock signal /Clk provide the timing for the falling edges of clock signal Clk in this example.

In the odd DFE structure, an M-level ADC 605A samples input signal Vin(t) on rising edges of a clock signal Clk to produce M speculative samples. A multiplexer 610A selects from among these samples to produce an odd sample data Dodd(n). A shift register 615 captures odd sample Dodd(n) on the next falling edge of clock signal Clk and uses this now resolved bit as feedback to a decoder 620A (and to a second decoder 620B as discussed below). Decoder 620A and multiplexer 610A then work as discussed above to select a sampler output from ADC 605A.

In the even DFE structure, an M-level ADC 605B samples input signal Vin(t) on rising edges of complementary clock signal /Clk to produce M speculative samples. A multiplexer 610B then selects from among these samples to produce an even sample Deven(n). Shift register 615 captures even sample Deven(n) on the next falling edge of clock signal /Clk and uses this now resolved bit as feedback to decoders 620A and 620B. In one embodiment, DFE 600 selects each even sample using just one previously resolved odd sample, and vice versa for each odd sample.

Figure 7:
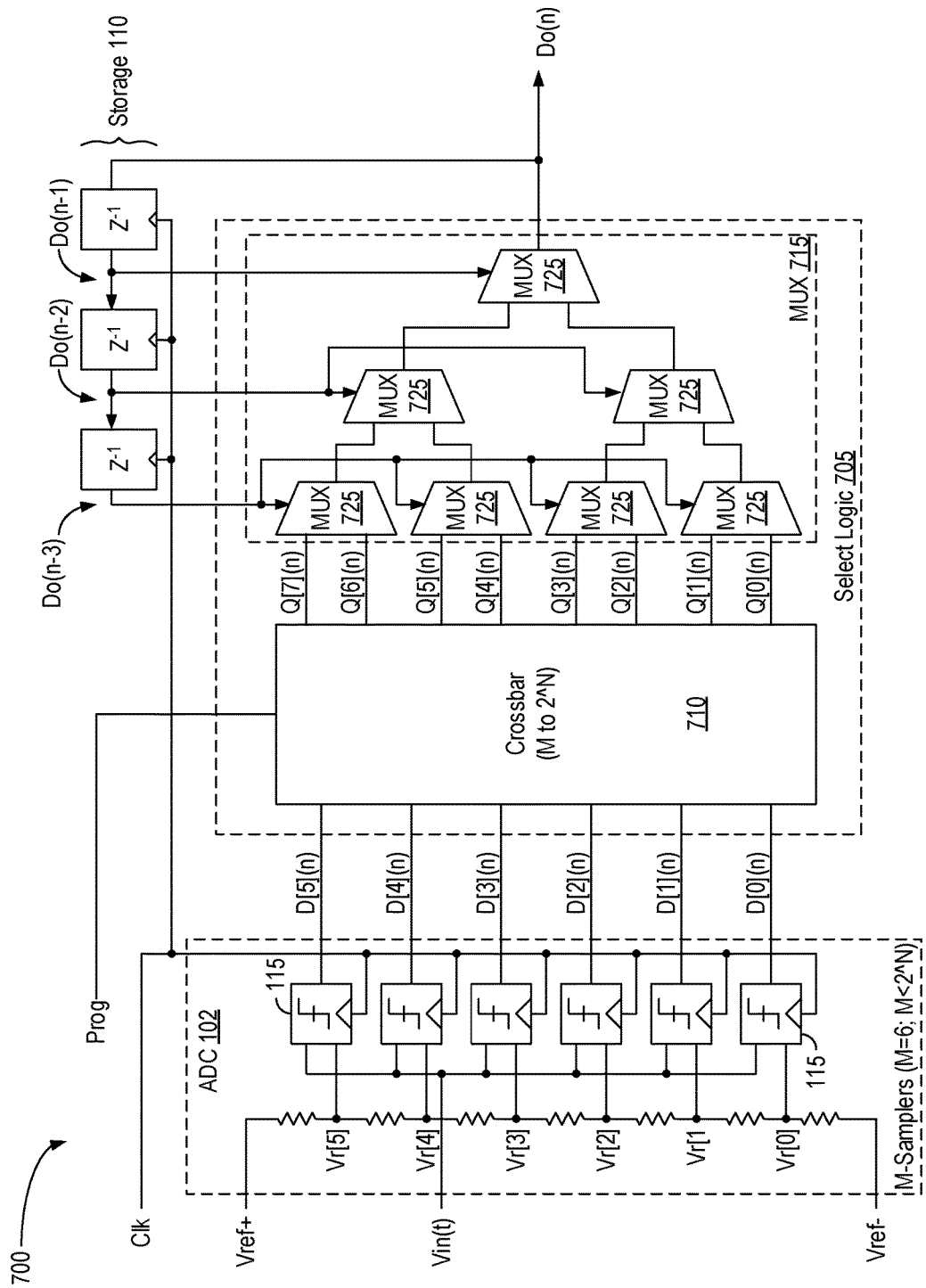

FIG. 7 depicts a DFE 700 in accordance with another embodiment that is similar to DFE 100, with like numbered components being the same or similar. DFE 700 includes an ADC 102 to sample input signal Vin(t) at each symbol time with respect to M reference voltages to produce M speculative samples D[5:0](n). Similar to DFE 100 of FIG. 1, DFE 700 stores a history of N previously resolved bits in storage 110. N is three in this example, and the three previously resolved bits are Do(n-1), Do(n-2), and Do(n-3). Select logic 705 selects a presently resolved bit Do(n) based upon a programmable correspondence between the previously resolved bits and one of the speculative samples. Thus, DFE 700 offers many of the same benefits of DFE 100, such as allowing for the use of M samplers where M<$2^N$.

Select logic 705 includes a crossbar switch 710 and multiplexer 715, the latter of which is made up of seven two-to-one multiplexers 725 in this embodiment. Crossbar switch 710 includes a matrix of switches (not shown) that can be programmed to map the M speculative sample lines D[5:0](n) to the $2^N$ output lines Q[7:0](n). Because crossbar switch 710 has more inputs than outputs, at least one of lines D[5:0](n) will connect to multiple ones of outputs Q[7:0](n). Multiplexer 715 then uses the N previously resolved bits Do(n-3), Do(n-2), and Do(n-1) to select from among the $2^N$ speculative samples Q[7:0](n). Speculative samples Q[7:0](n) need not include each of speculative samples D[5:0](n).

Multiplexer 715 has $2^N$ inputs, which is the same number as the selector in a PrDFE equalizer. However, unlike a PrDFE equalizer, DFE 700 can still have less than $2^N$ sampling paths. A programming port Prog can be used to permanently or temporarily configure crossbar 710 to select from among speculative samples D[5:0](n). Since each select logic input Q[7:0](n) is selected as the resolved bit Do(n) in response to a particular data pattern in storage 110, crossbar 710 can therefore be programmed to allow any of the sampler outputs D[5:0](n) to be selected as the presently resolved bit in response to a particular data pattern.

In one embodiment of DFE 700, crossbar 710 may be programmable such that any of the eight outputs Q[7:0](n) can be assigned to any of the six inputs D[5:0](n), in which case it is said to implement a "full" or "complete" crossbar function. In other embodiments crossbar 710 may be restricted such that each one of the crossbar outputs can only be assigned to a particular limited subset of the crossbar inputs. While this restricts the set of sampler outputs that can be assigned via programming port Prog to be selected for each individual bit history, it greatly reduces the logical complexity of crossbar 710. In this case, crossbar 710 may be referred to as a "partial" or "limited" crossbar.

While DFE 700 offers the same programmable equalizing capability as DFE 100, it achieves its programmability by using crossbar 710 instead of decoder 120 as in DFE 100. Removing the decoder from the feedback path allows DFE 700 to operate at a higher speed than DFE 100. While crossbar 710 does add finite delay in mapping the various sampler outputs to the select logic inputs, this delay is outside of the equalizer feedback loop. Therefore, this delay increases the latency in resolving the present bit, but does not directly decrease the maximum bit rate that DFE 700 can achieve. For example, because crossbar 710 does not involve feedback, it can use well known logic techniques such as logic pipelining to increase its maximum symbol rate at a cost in increased latency.

Figure 8:
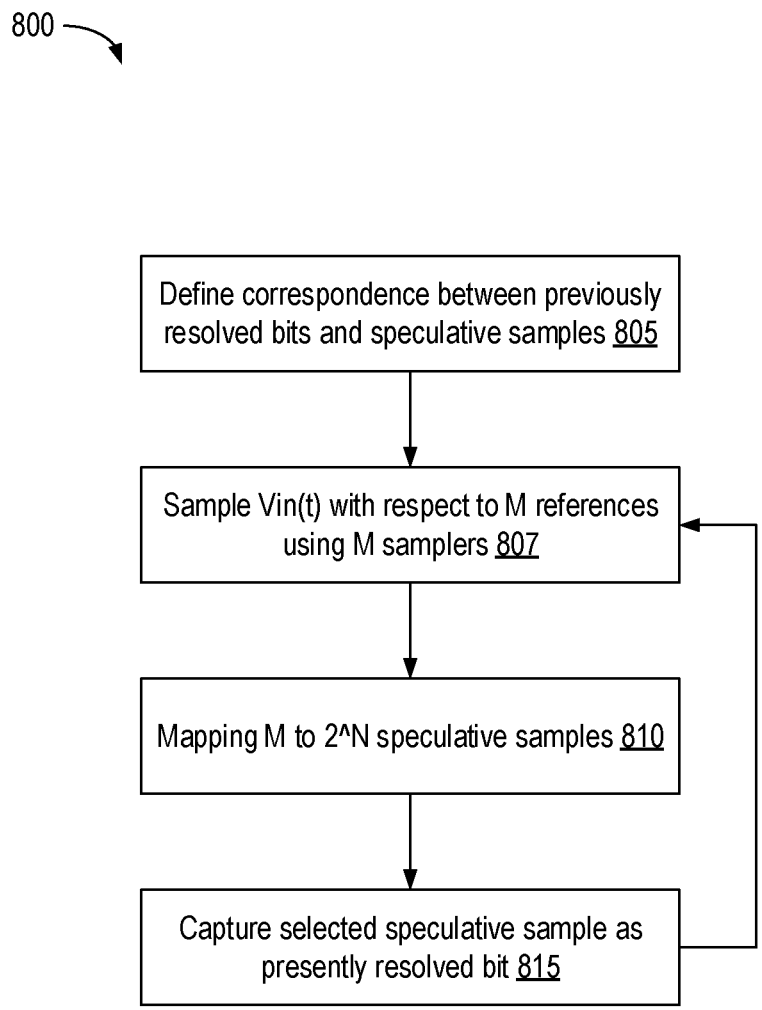
FIG. 8 is a flowchart 800 depicting the operation of a DFE 700 of FIG. 7 in accordance with one embodiment.

FIG. 8 is a flowchart 800 depicting the operation of a DFE 700 of FIG. 7 in accordance with one embodiment. Beginning at 805, crossbar 710 is programmed to define a correspondence between previously resolved bits and the M speculative samples D[5:0](n) using calibration procedures noted previously. The mechanisms used for programming crossbar 710 can be the same as those discussed above for the decoder. Once DFE 700 is thus programmed, ADC 102 samples signal Vin(t) with respect to M reference voltages Vr[5:0] during the same symbol time (807). Per 810 of FIG. 8, crossbar 710 maps the M speculative samples to the $2^N$ inputs to multiplexer 715 so that select logic 705 can use the previously resolved bits in storage 110 to select the output of the one of samplers 115 that best accounts for the ISI from the previously resolved bits. Storage 110 then shifts in the presently resolved bit, the output of sampler output Do(n), which then becomes previously resolved bit Do(n-1) in the next sample instant (815). The process then returns to 805 and repeats for the next and all successive symbol times of signal Vin(t).

The foregoing examples support binary modulation schemes in which each incoming symbol is a voltage level representative of two alternative binary values. In other modulation schemes a given symbol may represent multiple bits by dividing the gamut of voltages into more than two possible ranges. In so-called 4-PAM systems, where "PAM" stands for "pulse-amplitude modulation," each symbol can fall within four possible ranges, each range representing two binary bits. In the 4-PAM case, the speculative samples from three samplers would be decoded into a two-bit symbol representation. Either the three speculative samples or the decoded to-bit symbol representation could be used as feedback to select the next set of speculative samples. More generally, multi-PAM systems represent N binary values using $2^N$ voltage ranges. DFEs in accordance with some embodiments support multi-PAM modulation schemes, or are configurable to support different modulation schemes, including at least one type of multi-PAM scheme.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments are also envisioned. For example, the DDR embodiment of FIG. 6 can be extended to e.g. QDR DFEs. These examples are in no way exhaustive, as many alternatives within the scope of the claims will be obvious to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. In U.S. Applications, only those claims specifically reciting "means for" or "step for" should be construed in the manner required under the sixth paragraph of 35 U.S.C. § 112.

What is claimed is:

1. An equalizer comprising:
    M samplers to sample an analog signal during a given symbol time, each of the M samplers to sample the analog signal with respect to a corresponding one of a range of sample instants and a corresponding one of a range of reference levels to produce M speculative samples;
    select logic to convey, within the given symbol time, a selected one of the M speculative samples as a presently resolved bit; and
    storage to store N previously resolved bits, where 2^N is less than M;
    the select logic to select the presently resolved bit based on a correspondence between the N previously resolved bits and the M speculative samples.

2. The equalizer of claim 1, wherein the select logic is programmable to program the correspondence between the N previously resolved bits and the M speculative samples.

3. The equalizer of claim 2, wherein the select logic is externally programmable to define how the select logic defines the correspondence between the N previously resolved bits and the M speculative samples.

4. The equalizer of claim 2, wherein the select logic is externally programmable to define a second correspondence between each possible pattern of the N previously resolved bits and one of the M speculative samples.

5. An equalizer comprising:
    M samplers to sample an analog signal during a given symbol time, each of the M samplers to sample the analog signal with respect to a corresponding one of a range of sample instants and a corresponding one of a range of reference levels to produce M speculative samples;
    select logic to convey a selected one of the M speculative samples as a presently resolved bit; and
    storage to store N previously resolved bits, where 2^N is less than M;
    the select logic to select the presently resolved bit based on a correspondence between the N previously resolved bits and the M speculative samples; and
    the storage to store a total number of previously resolved bits that is more than the N previously resolved bits, the equalizer further including a decoder to select the N previously resolved bits from the total number of previously resolved bits.

6. The equalizer of claim 1, further comprising a cross-bar switch interconnecting the samplers with the select logic.

7. The equalizer of claim 1, wherein the select logic further includes a decoder and a multiplexer, the decoder to decode the N previously resolved bits into a decoder output, the multiplexer to produce the presently resolved bit from the M speculative samples in response to the decoder output.

8. The equalizer of claim 1, wherein the select logic conveys the same selected one of the M speculative samples as the presently resolved bit responsive to more than one pattern of the N previously resolved bits.

9. The equalizer of claim 1, further comprising an analog-to-digital converter to sample the analog signal during a second symbol time to produce M additional speculative samples.

10. The equalizer of claim 9, further comprising second select logic coupled to the analog-to-digital converter to select a second presently resolved bit for the second symbol time from the additional speculative samples.

11. A method of equalizing an analog signal, the method comprising:
    sampling the analog signal during previous symbol times to obtain N previously resolved bits;
    storing the N previously resolved bits in storage;
    sampling the analog signal during a present symbol time with respect to M references and M phases to obtain M speculative samples, where 2^N is less than M;
    selecting one of the M speculative samples, within the present symbol time, as a presently resolved bit using select logic defining a correspondence between the N previously resolved bits and the M speculative samples;

storing the presently resolved bit in the storage as a most-recent previously resolved bit; and varying ones of the M phases relative to one another to select preferred sample instants.

12. The method of claim 11, further comprising programming the correspondence between the N previously resolved bits and the selected one of the M speculative samples.

13. The method of claim 11, further comprising sampling the analog signal using alternative analog-to-digital converters during adjacent symbol times to obtain adjacent groups of speculative samples.

14. The method of claim 13, further comprising selecting a speculative sample from one of the alternative analog-to-digital converters as the presently resolved bit using a previously resolved bit from the other of the analog-to-digital converters.

15. The method of claim 11, further comprising storing more than the N previously resolved bits in the storage and programmably selecting the N previously resolved bits from the storage.

16. An equalizer comprising:

an analog-to-digital converter (ADC) to sample an analog signal with respect to M references and M phases during a symbol time to produce M speculative samples;

means for decoding N previously resolved samples of the analog signal to select one of the M speculative samples as a presently resolved bit within the symbol time, wherein M is not $2^N$, and wherein the means for decoding provides a programmable correspondence between the N previously resolved samples and the M speculative samples; and means for updating the previously resolved samples to include the selected one of the M speculative samples.

17. The equalizer of claim 16, wherein the means for decoding the N previously resolved samples programmably selects the N previously resolved samples from a greater number of previously resolved samples.

18. The equalizer of claim 16, further comprising means for changing the correspondence between the previously resolved samples and the M speculative samples.

19. The equalizer of claim 16, wherein M is less than $2^N$.

* * * * *